United States Patent [19]

Kasai et al.

[11] Patent Number: 4,641,344
[45] Date of Patent: Feb. 3, 1987

[54] AUDIO EQUIPMENT

[75] Inventors: Junichi Kasai, Yokohama; Hiroshi Imai, Yokosuka, both of Japan

[73] Assignee: Nissan Motor Company, Limited, Japan

[21] Appl. No.: 688,992

[22] Filed: Jan. 4, 1985

[30] Foreign Application Priority Data

| Jan. 6, 1984 [JP] | Japan | 59-1214 |
| Feb. 24, 1984 [JP] | Japan | 59-33797 |
| Jul. 2, 1984 [JP] | Japan | 59-135171 |

[51] Int. Cl.⁴ .............................................. H03G 3/20
[52] U.S. Cl. ........................................ 381/57; 381/86; 455/234
[58] Field of Search ................... 381/57, 86, 107, 108, 381/106; 455/234, 238

[56] References Cited

U.S. PATENT DOCUMENTS

| 4,061,874 | 12/1977 | Fricke | 381/57 |
| 4,271,535 | 6/1981 | Fukuhara et al. | 455/309 |
| 4,314,232 | 2/1982 | Tsunoda | 340/52 F |
| 4,342,023 | 7/1982 | Tsunoda | 381/57 |
| 4,346,364 | 8/1982 | Takagi et al. | 340/52 D |
| 4,352,088 | 9/1982 | Tsunoda | 340/52 F |
| 4,352,089 | 9/1982 | Yano et al. | 340/52 F |
| 4,359,713 | 11/1982 | Tsunoda | 340/52 F |
| 4,359,714 | 11/1982 | Tsunoda et al. | 340/52 F |
| 4,373,116 | 2/1983 | Shimuzu et al. | 179/15 M |
| 4,380,824 | 4/1983 | Inoue | 381/86 |
| 4,476,571 | 10/1984 | Tokumo | 381/57 |
| 4,506,380 | 3/1985 | Matsui | 381/86 |
| 4,553,257 | 11/1985 | Mori | 381/57 |

FOREIGN PATENT DOCUMENTS 58-219834 12/1983 Japan .................................. 455/238

OTHER PUBLICATIONS

Nissan Service Weekly Report (Nissan Service Syuho in Japanese), vol. No. 428, (LP-1) pp. 270, 271, Sep., 1980.

*Primary Examiner*—Gene Z. Rubinson
*Assistant Examiner*—L. C. Schroeder
*Attorney, Agent, or Firm*—Lowe, Price, LeBlanc, Becker & Shur

[57] ABSTRACT

Audio equipment designed for use at widely varying ambient noise levels allows an audio signal to be amplified to enhanced levels under noisy conditions without added distortion near the high-amplitude end of its dynamic range. Detected or anticipated ambient noise conditions trigger a dynamic range controller to boost the gain of the audio signal to an extent inversely related to the audio signal amplitude. Thus, low-volume audio will be boosted to a great extent while the high-volume end of the dynamic range will experience little or no additional gain. The net effect is two allowable dynamic ranges, both sharing the same high-end volume level but with possibly widely different low-end volume levels. This gain and dynamic range control may also be performed independently on a number of discrete frequency bands. In addition, noise components inherent to the audio signal may be filtered to ambient noise-dependent extends, or the gain boost may be inhibited at volume levels susceptible to such noise.

25 Claims, 18 Drawing Figures

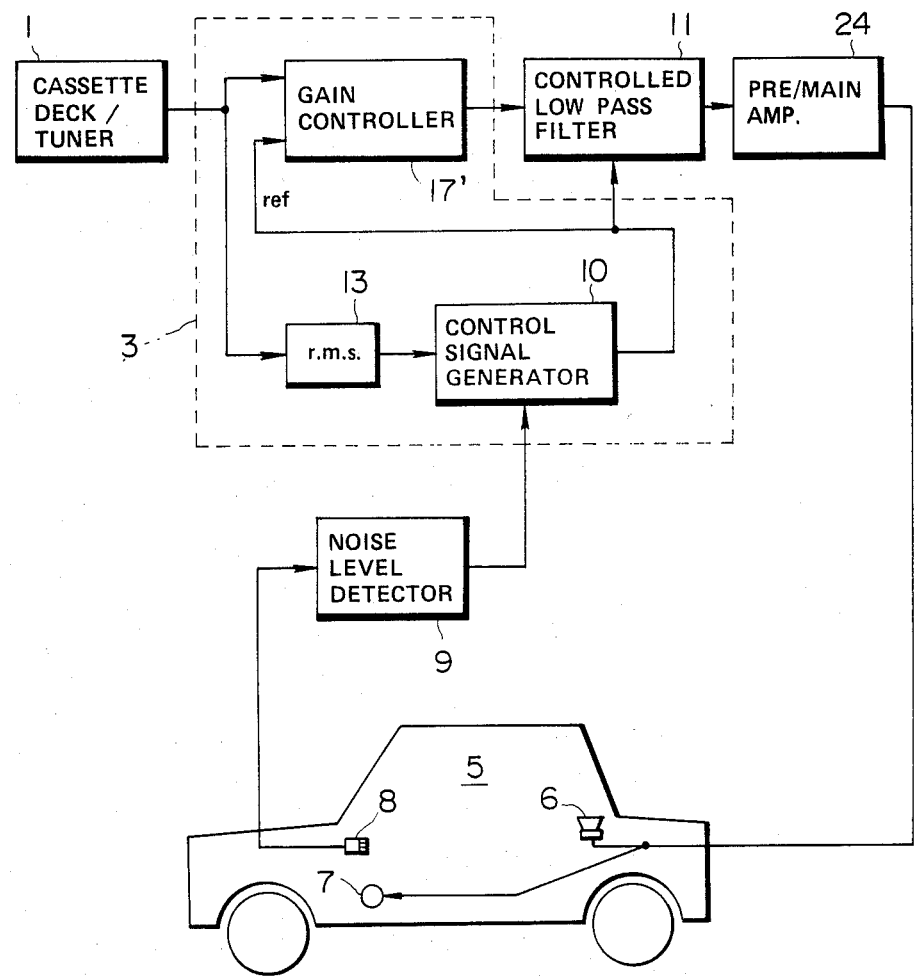

FIG.12
(A) 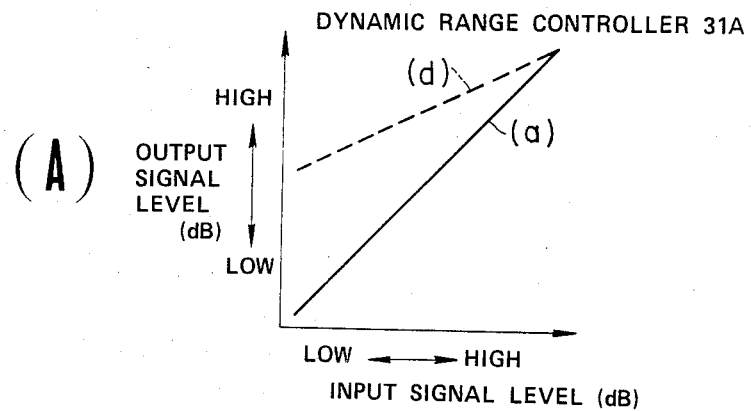
(B) 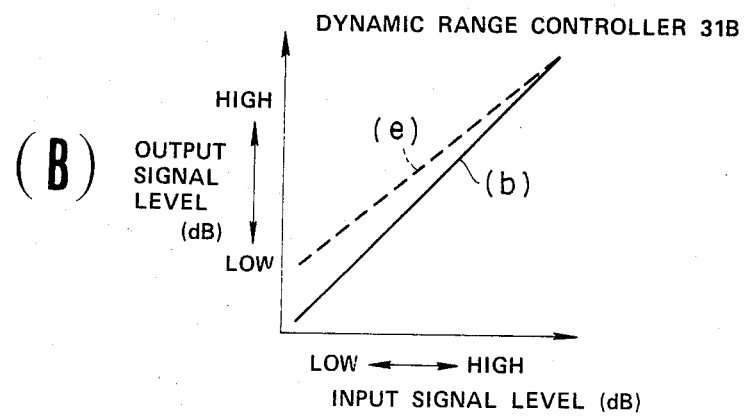
(C) 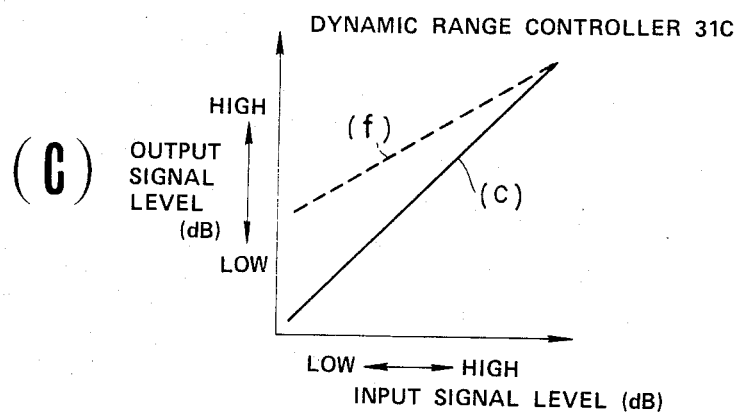

4,641,344

AUDIO EQUIPMENT

BACKGROUND OF THE INVENTION

1. Field of the Invention

The present invention relates generally to audio equipment which can always obtain an appropriate sound characteristic without being affected by ambient noises.

2. Description of the Prior Art

When listening to reproduced sound in a noisy environment, a listener often cannot clearly hear the reproduced sound due to the high ambient noise level.

For example, in the case of stereo equipment installed within an automotive vehicle compartment, the reproduced sound becomes difficult to resolve due to the relatively high noise level within the compartment while the vehicle is running even though the output volume of the stereo can be appropriately adjusted while the vehicle is at rest.

A conventional audio system which solves the above-described problem has been reduced to practice. The contents of the conventional audio equipment is described in "NISSAN SERVICE WEEKLY REPORT No. 428 (LP-1)" Pages 270 and 271 published by Nissan Motor Company Limited on September, 1980. In this publication, the conventional audio equipment monitors the ambient noise level, checks the position of a fan speed changeover switch of an air conditioner, and automatically controls the output volume level of an amplifier in the audio system according to these conditions so that the reproduced sound can be easily resolved despite a high ambient noise level.

However, there is a problem in the above-described conventional audio equipment in that since the output sound level varies only according to the ambient noise level, the output sound in frequency bands which are easy to resolve is amplified together with other frequency bands which are more difficult to resolve so that the overall output volume may become too loud. In the worst case, the output sound will be distorted to a displeasing extent.

SUMMARY OF THE INVENTION

With the above-described problem in mind, it is an object of the present invention to provide an audio system which controls the dynamic range of a reproduced audio signal in accordance with the ambient noise level so as to ensure an appropriate output volume.

To achieve the above object, the audio equipment comprises means for monitoring the ambient noise level, means for generating and reproducing an audio signal and means for variably controlling the dynamic range of the reproduced audio signal in accordance with the detected ambient noise level.

BRIEF DESCRIPTION OF THE DRAWINGS

A more complete understanding of the present invention may be derived from the following description in conjunction with the drawings in which like reference numerals designate corresponding elements and in which;

FIG. 8 is a block circuit diagram of a third preferred embodiment according to the present invention;

FIGS. 12(A), (B) and (C) are input-output graphs of the dynamic range controllers of FIG. 11;

DETAILED DESCRIPTION OF THE PREFERRED EMBODIMENTS

Reference will hereinafter be made to the drawings in order to facilitate understanding of the present invention.

Figure 1:
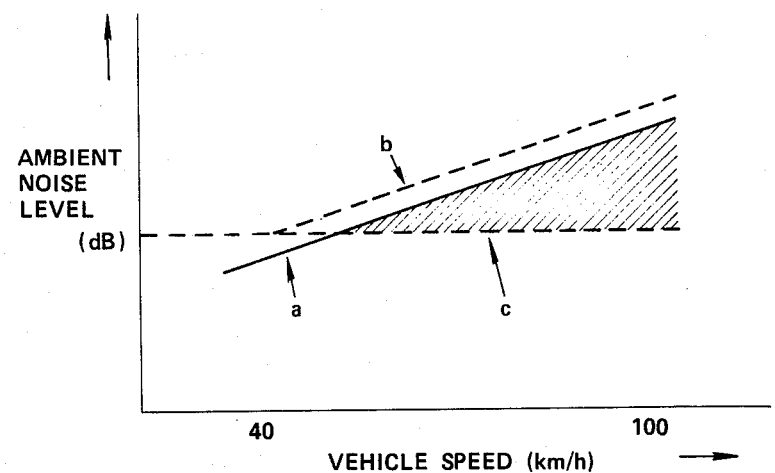
FIG. 1 is a graph of the output volume characteristics of the conventional audio system described in "NISSAN SERVICE WEEKLY REPORT No. 428 (LP-1)", Pages 270 and 271.

FIG. 1 shows the output volume characteristics of the conventional audio system disclosed in the above-mentioned NISSAN SERVICE WEEKLY REPORT No. 428. As shown in FIG. 1, the output volume, represented by broken line b, is adjusted to a desired level when the vehicle is at rest, increases as the vehicle speed increases, accompanying the increase of the ambient noise level represented by solid line a. It should be noted that symbol c denotes the manually selected output volume of the audio equipment which is overridden when the output volume starts to be adjusted automatically in accordance with the increase in the ambient noise level. Note that the output volume is held to a constant offset from the ambient noise level.

Figure 2:
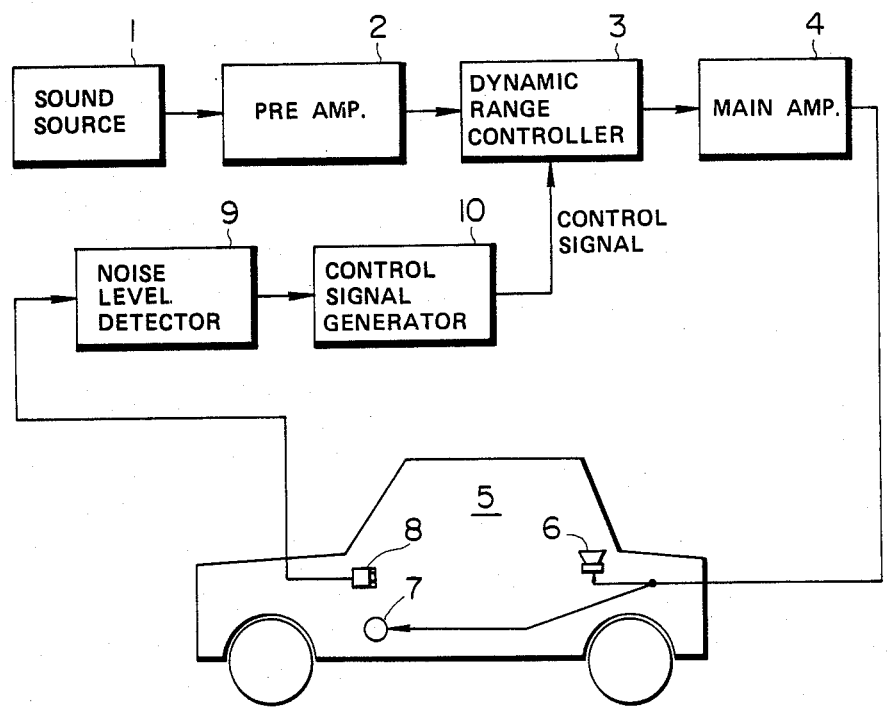
FIG. 2 is a block circuit diagram of a first preferred embodiment according to the present invention.

FIG. 2 shows a circuit block diagram of a first preferred embodiment of the present invention.

In FIG. 2, numeral 1 denotes a sound source. The sound source 1 may be, for example, a tuner for receiving a broadcasting signal and/or a cassette deck. Numeral 2 denotes a preamplifier which amplifies an audio input signal from the sound source 1. Numeral 3 denotes a dynamic range controller and numeral 4 denotes a main amplifier which amplifies the audio signal from the preamplifier 2 via the dynamic range controller 3. Numerals 6 and 7 denote speakers installed within the passenger compartment 5. Numeral 8 denotes a microphone which picks up ambient sound in the passenger compartment and outputs an analog signal indicative thereof. Numeral 9 denotes a noise level detector which forms the sound signal picked up by the microphone 8 into an ambient noise level signal. The word ambient refers to the environment surrounding the audio equipment, i.e., the passenger compartment. Numeral 10 denotes a control signal generator which receives the output signal from the noise level detector representing the ambient noise level and converts it to an analog control signal. The control signal from the signal generator 10 is sent to the dynamic range controller 3.

Figure 3:
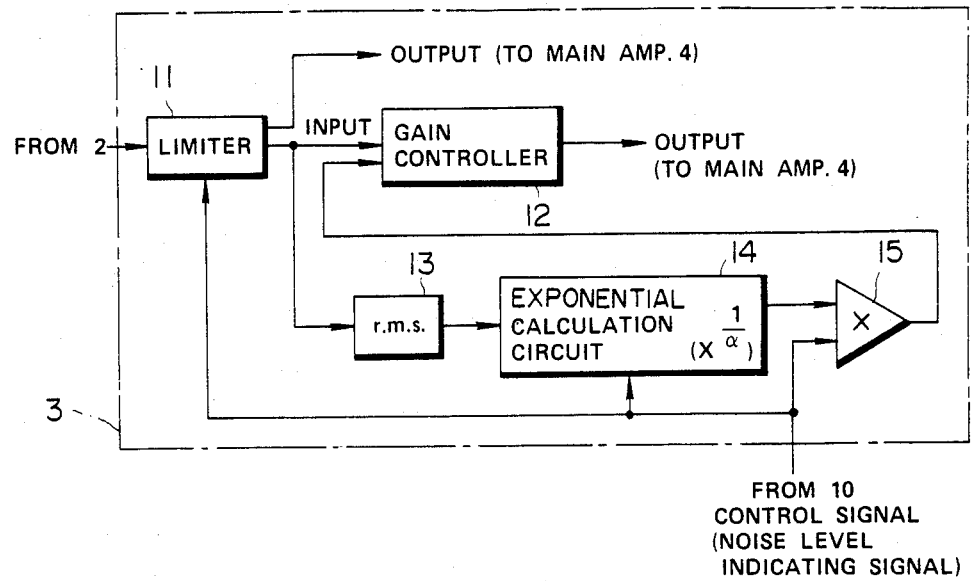
FIGS. 3(A) and (B) are internal circuit block diagrams of the dynamic range controller shown in FIG. 2.
Figure 3:
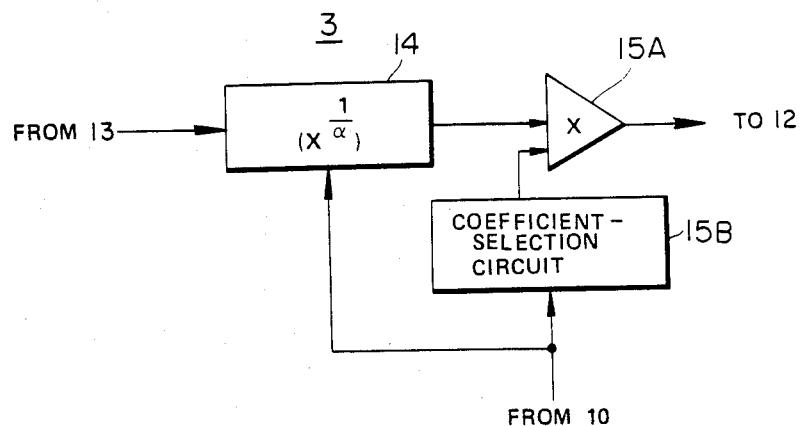

FIG. 3 shows the internal circuit configuration of the dynamic range controller 3. The dynamic range controller 3 comprises a limiter 11 connected for input from both preamplifier 2 and signal generator 10 and serving to pass the audio input signal from the preamplifier to a gain controller 12 when the input signal level exceeds a reference level and the ambient noise level indicated by the control signal from the signal generator 10 exceeds a predetermined value and otherwise to pass the audio input signal directly to the main amplifier. Numeral 13 denotes an averaging circuit (root-mean-square (RMS) calculation circuit) which receives the audio signal from the limiter 11 and converts it into an average effective value, i.e., outputs a continuously varying signal reflecting the results of root-mean-square calculation. Numeral 14 denotes an exponential calculation circuit which receives the signals from the transducer 10 and averaging circuit 13 and finds a variable root of the average effective value, i.e. the value $X^{1/a}$, where $a$ is the ambient noise level and X is the RMS input level. Numeral 15 denotes an adder which adds the output value to the calculation circuit 14 to the output value of the signal generator 10. The sum from the adder 15 is sent to the gain controller 12. The gain controller 12 controls the amplification factor of the audio input signal and outputs a gain-controlled audio signal to the main amplifier 4. Alternatively, the output signal representing the value $X^{1/a}$ from a function generator, e.g. the exponential calculation circuit 14 can be sent to a multiplier 15A as shown diagrammatically in FIG. 3(B). In this case, the control signal representing the ambient noise level is sent to a coefficient selection circuit 15B wherein one of a plurality of constants is selected according to the noise level indicated by the control signal. The multiplier 15A receives inputs from the calculation circuit 14 and from the coefficient-selection circuit 15B. The multiplier 15A multiplies the output signal level from the calculation circuit 14 by the selected constant and the product is sent to the gain controller 12.

Figure 4:
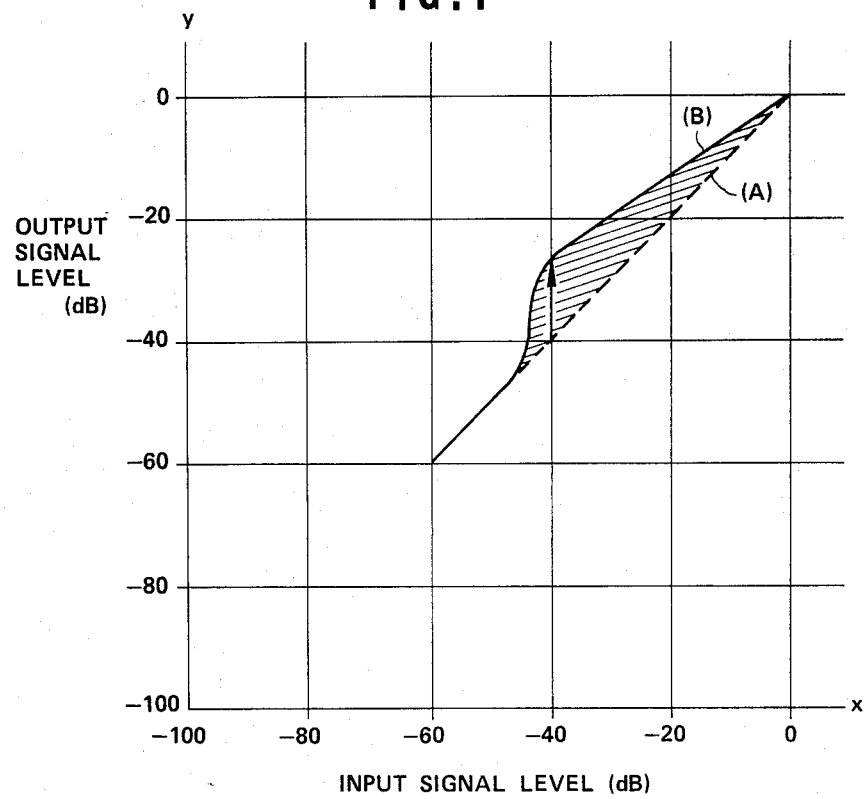
FIG. 4 is a graph of amplification characteristics of the dynamic range controller shown in FIGS. 2 and 3(A)

The output sound characteristics of the main amplifier 4 are shown in FIG. 4, wherein the X-axis represents the input level from the preamplifier 2 and the Y-axis represents the output level from the main amplifier 4.

As shown in FIG. 4, the output level of the main amplifier 4 tends to increase in direct proportion to the input from the preamplifier 2 as indicated by the broken line (A). However, the limiter 11 recognizes when the input signal level exceeds a reference value, e.g., −40 dB and in such cases, the gain controller 12 boosts the audio signal level in accordance with the noise level indicated by the output signal of the signal generator 10. At the highest ambient noise levels, the audio input/output curve assumes the form indicated by the solid line (B). Intermediate noise levels induce input/output characteristics between the curves (A) and (B).

Figure 5:
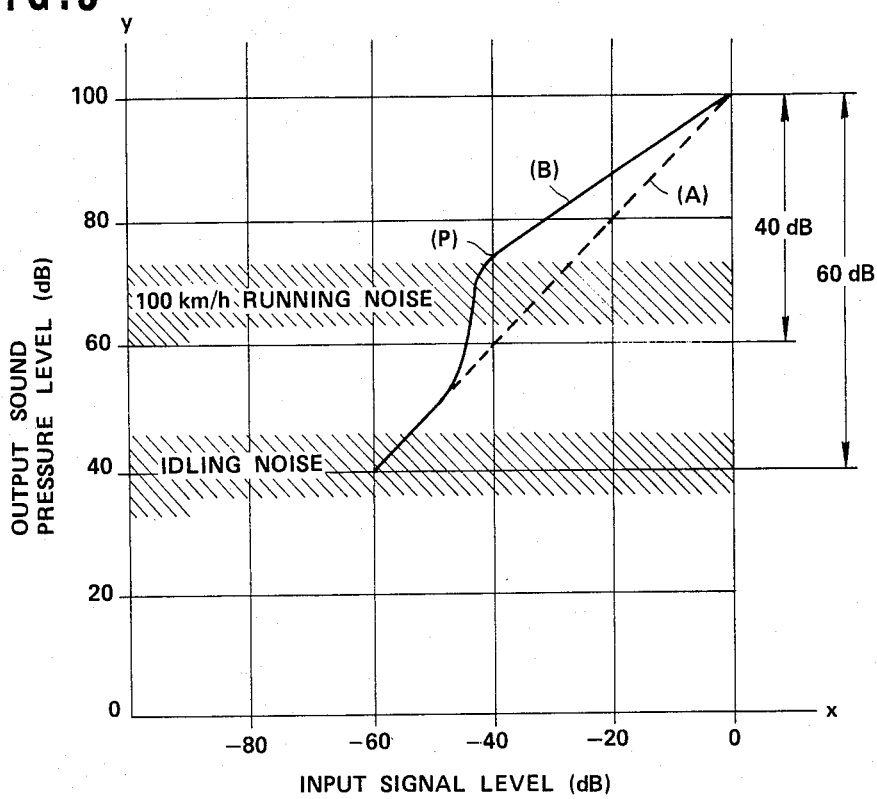
FIG. 5 is a graph illustrating the relationship between the input-output curve of the circuit shown in FIG. 1 and the ambient noise level.

It should be noted that the limiter 11 excludes input signal levels below −40 dB since input signals below −40 dB tend to include residual noise from the sound source 1. The sound source 1, comprising for example, an FM broadcasting tuner and/or cassette tape deck, normally has a dynamic range of about 60 dB as shown in FIG. 5. Assuming a maximum volume level of 100 dB, this means that the audio reproduction equipment works within the range from 40 dB to 100 dB. On the other hand, the noise within the passenger compartment 5 increases as the engine starts to run and the vehicle starts to move. In the case of engine idling, the noise level within the passenger compartment 5 is approximately 45 dB. In the case when the vehicle is moving at about 100 km/h, the noise level is approximately 73 dB. As the vehicle moves at speeds up to 100 km/h, the noise level changes according to the vehicle speed.

The dynamic range controller 3 controls the audio signal in accordance with the input/output characteristics shown in FIG. 4 wherein at input levels above −40 dB, lower-volume outputs are amplified to a relatively great extent while not altering the maximum output value at all, so that the dynamic range of the audio signal is compressed to within approximately 40 dB.

If an input signal at −40 dB is received from the preamplifier 2, while the vehicle is moving at 100 km/h, the ambient noise would drown out the reproduced audio output (∼60 dB) through the speakers 6, 7 if the dynamic range controller 3 were not employed, as can be seen at (P) in FIG. 5. The output sound pressure level at this point is approximately 74 dB so that the output reproduced sound is easy to resolve despite the noise.

High-volume output sounds near pressure levels of 100 dB will not be amplified significantly as appreciated from the characteristic curve of the dynamic range controller 12A shown in FIGS. 4 and 5, in order to prevent displeasing distortion phenonema from occurring.

It should be noted that although in the first embodiment the dynamic range controller 3 changes the dynamic range continuously according to the ambient noise level with the maximum volume level being unchanged, alternatively the dynamic range controller 3 may adjust the dynamic range selectively through a number of predetermined ranges as the ambient noise level passes through constant reference values. In this case, the internal circuit configuration could be simplified as mentioned previously.

Figure 6:
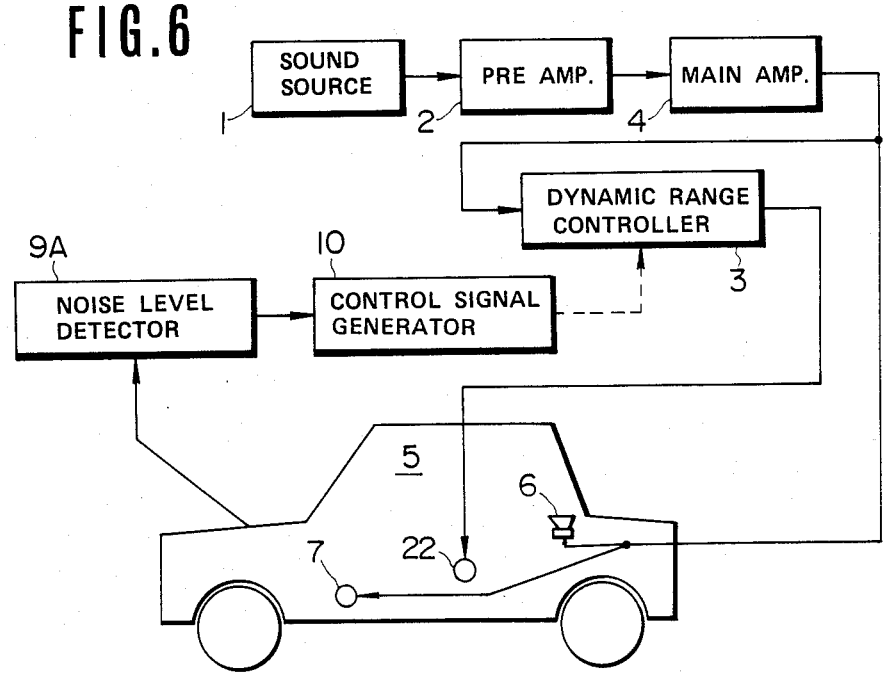
FIG. 6 is a block circuit diagram of a second preferred embodiment according to the present invention.

FIG. 6 shows a second preferred embodiment. In the second embodiment, another type of noise level detector 9A monitors ambient noise factors such as vehicle speed, engine revolution speed, air conditioner fan speed, opening angle of door window, road surface conditions, steering angle, passage through tunnels, wiper operation, etc. and estimates the total current ambient noise level on the basis of predetermined noise level values for each of the measure conditions shown in FIG. 7(B).

In this embodiment, the audio signal from the sound source 1 is amplified by the preamplifier 2 and the main amplifier 4 and reproduced by the speakers 6, 7 independently of the ambient noise level. The noise level detector 9A estimates the ambient noise level from the above-mentioned monitored factors.

Figure 7A:
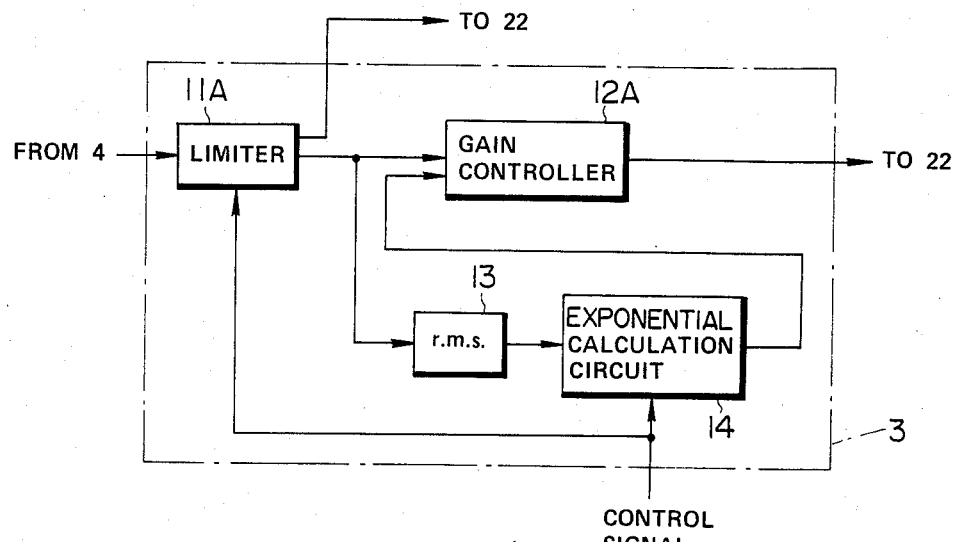
FIG. 7(A) is an internal block circuit diagram of the dynamic range controller shown in FIG. 6.
Figure 7B:
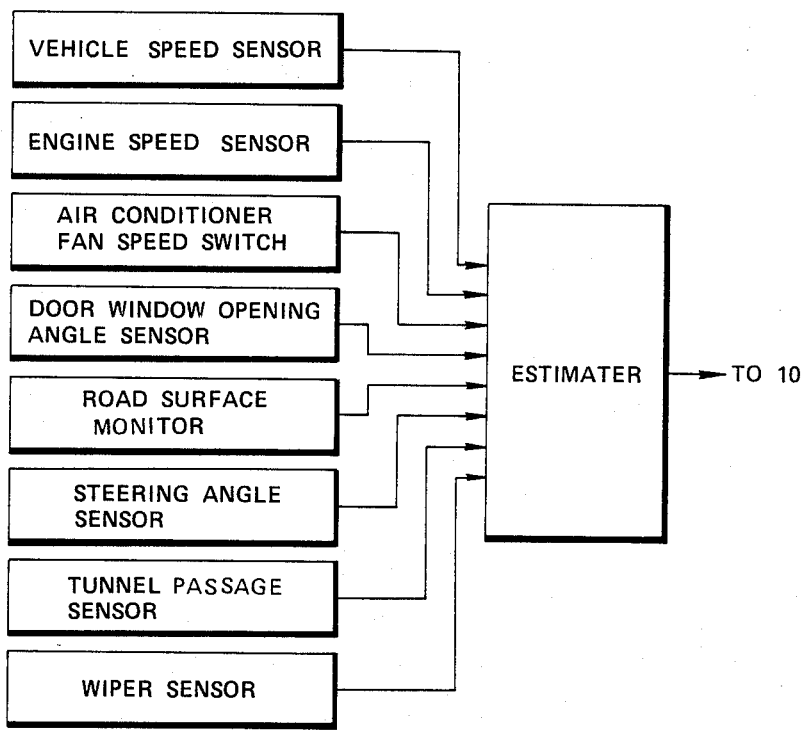
FIG. 7(B) is a block diagram of the level detector shown in FIG. 6.

FIG. 7(A) shows the internal configuration of a secondary variable-gain amplifier 17, in which the limiter 11A is provided for sending a part of the tone signal to a gain controller 12A in the same manner as described in the first preferred embodiment. The average effective value of the part of the signal inputted to the gain controller 12A is derived by the averaging circuit 13 and is sent to the calculation circuit 14. The calculation circuit 14 derives a signal indicative of the value $X^{1/\alpha}$ from the average audio level and the estimated noise level and outputs a corresponding control signal to the gain controller 19. The gain controller 19 then attenuates the audio input signal from the limiter 11A in accordance with the control signal. The output signal from the gain controller 12A is reproduced by another speaker 22 installed within the passenger compartment 5. The signal generator 10 outputs the control signal according to the value of the ambient noise level derived from the noise level detector 9A to a variable-gain amplifier 17 which amplifies audio signals at small volume levels. The output of the secondary amplifier 17 is reproduced by an additional speaker 22. Therefore, the speaker 22 enhances audio signals at low volumes which would otherwise be drowned out by noise. Consequently, the vehicle occupant(s) can clearly hear reproduced sounds even at relatively low volume despite ambient noise. Since high-volume audio sounds can be heard at normal gain through the speakers 6, 7, uncomfortably loud audio sound due to over-amplification of the audio signal and so phenomena such as distortion and clipping can be prevented.

FIG. 8 shows a third preferred embodiment.

In the third preferred embodiment, in order to eliminate low-volume noise such as tape hiss from the audio input signal without adversely affecting low-volume audio sound, a controlled low-pass filter 11 is connected after a gain controller 17' in order to filter high-frequency components out of audio signals amplified by the gain controller 17'. Thus, a low level noise such as tape hiss will not be audible, even during brief, low-volume periods. In more detail, the third embodiment of an audio system comprises: (a) the sound source 1; (b) the gain controller 17' exhibiting the input-output characteristics shown in FIG. 9 (described later); (c) the average effective value calculation (r.m.s.) circuit 13 which outputs a signal indicative of the root-mean-square value of the audio input signal from the sound souce 1; (d) control signal generator 10 which converts the output signal of the root-mean-square value calculation circuit 13 into a control signal in accordance with the ambient noise level; (e) the controlled low-pass filter 11 described above which cuts off the high-frequency range above a predetermined frequency limit which is variably controlled by the control signal from the signal generator 10; (e) a preamplifier and main-amplifier (premain amp) 24 which amplifies the audio output signal from the controlled low-pass filter 11; and (f) a pair of speakers 6, 7 disposed within the passenger compartment 5.

In cases where the microphone 8 detects no spurious noise in the passenger compartment 5 as may occur when the engine is off, the audio input signal from the cassette deck or tuner, i.e., sound source 1 is, as always, amplified by the pre-and-main amplifiers 24 via the gain controller 17' and controlled low-pass filter 11 and reproduced through the speakers 6, 7. Since the ambient noise level is so low, the noise level detector 9 and following control signal generator 10 do not output the above-mentioned signal to the gain controller 17' and controlled low-pass filter 11. Hence, the gain controller 17' operates along the characteristic curve (a) of FIG. 9 while the controlled low-pass filter 11 operates at its highest cut-off frequency. Under normal conditions, tape hiss has a maximum output sound pressure noise level of approximately 50 dB as represented by the bar (A) in FIG. 9. Thus, throughout the dynamic range of the input signal, tape hiss does not stand out as a significant part of the audio output represented by curve (a) at relatively low input levels. Thus, the low-pass filter 11 is disabled in order to preserve high-frequency audio fidelity.

As the noise within the passenger compartment 5 increases after the engine is started and the vehicle starts to move, the noise level detector 9 detects the increase in the noise level via the microphone 8. The control signal generator 10 receives a signal indicative of the detected noise level from the noise level detector 9 and converts the average effective value of the audio signal from the averaging (r.m.s) circuit 13 into a control signal on the basis of the signal from the noise level detector 9. The control signal from the control signal generator 10 is sent to the gain controller 17' and controlled low-pass filter 11. The gain controller 17', in response to the control signal, controls the gain (arrow (c) in FIG. 9) of the audio signal according to the noise level so as to boost the audio output in accordance with characteristic curve (b) in FIG. 9.

Figure 9:
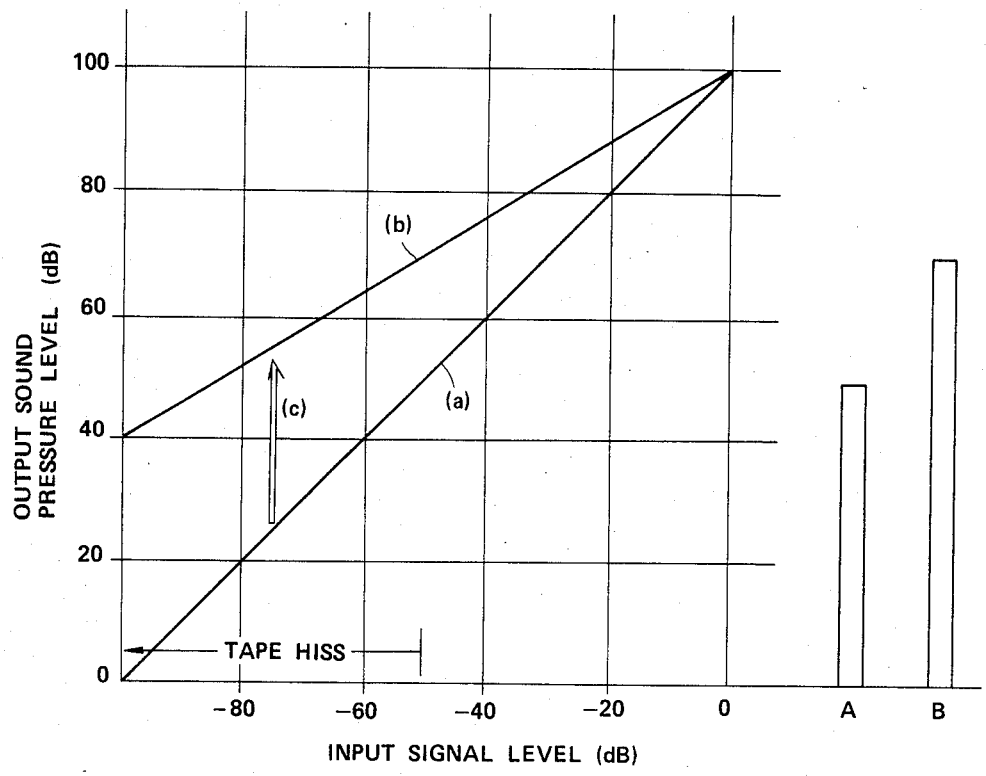
FIG. 9 is an input-output graph of the gain controller shown in FIG. 8.

In this case, since the level of the tape hiss component in the audio input is amplified together with the audio signal by the gain controller 17' the of tape hiss noise level may achieve a maximum output sound pressure level of 70 dB as represented by bar (B) of FIG. 9, assuming that the audio signal is amplified as indicated by the curve (b) and the controlled low-pass filter 11 does not function. In this case, the tape hiss noise would become a significant part of the audio output during relatively quiet periods and lapses between outputs. However, since the controlled low-pass filter 11 receives the control signal from the control signal generator 10, the controlled low-pass filter 11 operates so as to cut off the high-frequency range of the audio signal including tape hiss in accordance with the increase in gain, i.e., in accordance with the noise level within the passenger compartment 5. The premain amplifier 24 amplifies the resulting audio signal amplified according to curve (b) and filtered to remove the high-frequency range. The speakers 6, 7 reproduce the audio signal such that the reproduced low-volume sound which would be drowned out by ambient noise is boosted to a sound pressure level which can easily be resolved without similarly boosting the tape hiss. Consequently, the vehicle occupant(s) can listen to reproduce audio sound even at low volume amidst passenger vehicle compartment noise without tape hiss.

On the other hand, the maximum output sound pressure level (100 dB) remains unchanged as shown by the line (b) of FIG. 9. Thus, as in the previous embodiment, gain adjustment across the dynamic audio range according to the invention ensures clearly audible low-volume output and distortion-free high-volume output.

Figure 10:
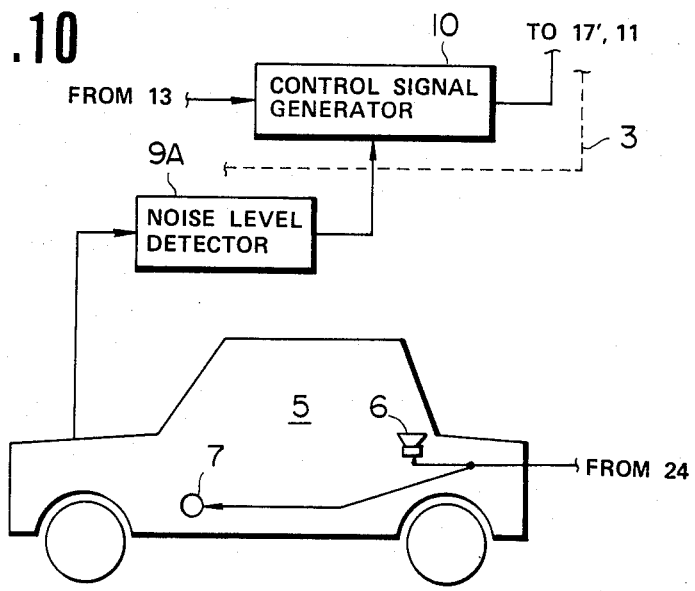
FIG. 10 is a block diagram of an essential part of a fourth preferred embodiment.

FIG. 10 shows a fourth preferred embodiment wherein the noise level detector 9a receives various data concerning the noise parameters, vehicle speed, engine revolution speed, air conditioner fan speed, opening angle of door windows, operation of wipers, passage through tunnels etc., and estimates the noise level on the basis of preset data as described with reference to the second embodiment. The estimated noise level is sent to the control signal generator 10 in the form of an electrical signal. The rest of the circuit configuration is the same as in FIG. 8. In this embodiment, the need for the microphone 8 shown in FIG. 8 is obviated so that the production cost can be reduced.

Figure 11:
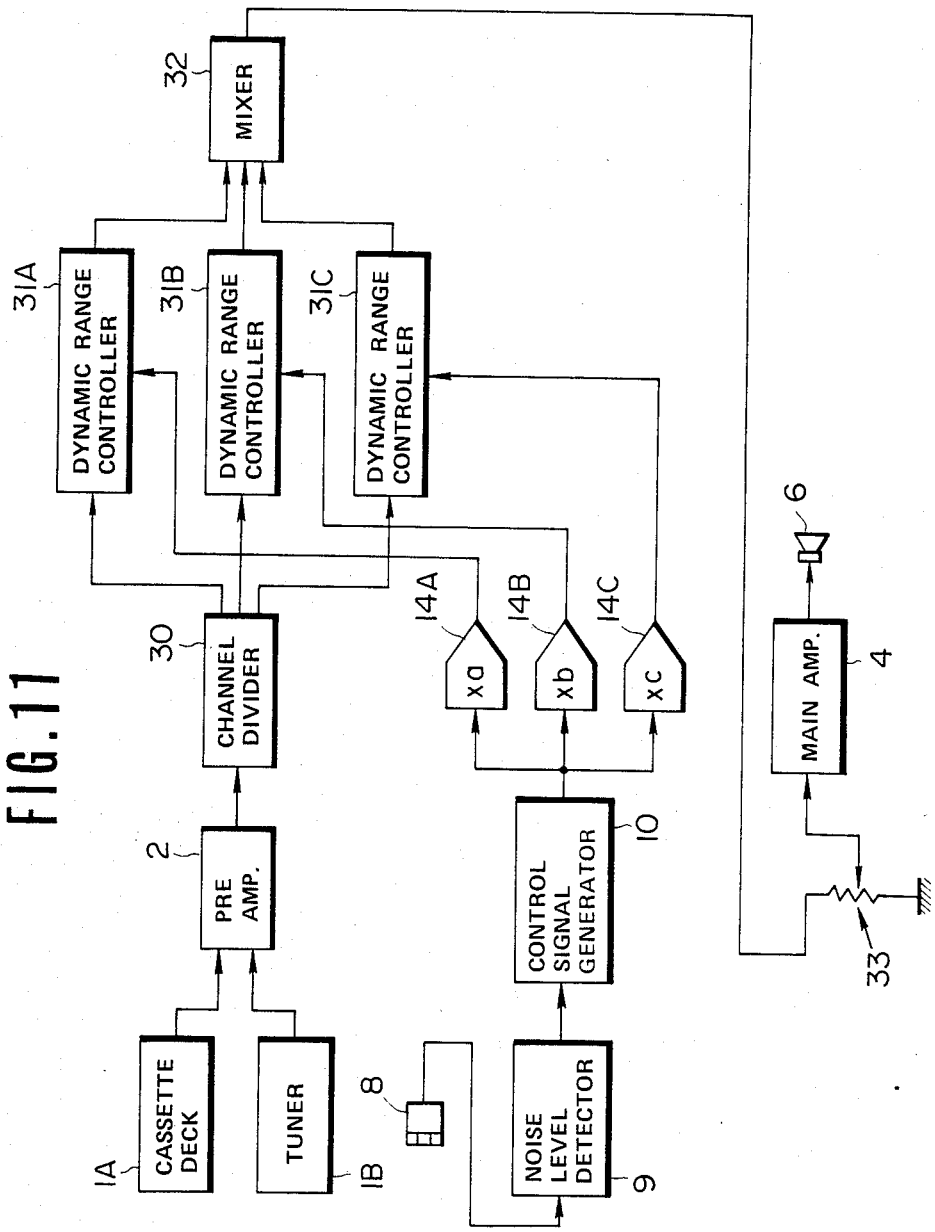
FIG. 11 is a block circuit diagram of a fifth preferred embodiment.

FIG. 11 shows a fifth preferred embodiment.

In FIG. 11, the sound source 1 comprises a cassette deck 1A and AM/FM tuner 1B, the output terminal of each being connected to the preamplifier 2. The output terminal of the preamplifier 2 is connected to a channel divider 30. The channel divider 30 comprises a three-channel divider having crossover frequencies of 500 Hz and 5 KHz so that the audio input is divided into frequency pass bands of less than 500 Hz, from 500 Hz to 5 KHz, and above 5 KHz. The three output terminals of the channel divider 30 are connected to the respective dynamic range controllers 31A, 31B, and 31C. The dynamic range controllers 31A, 31B, 31C control the respective dynamic ranges of the audio signal components in such a way that when the input voltage level is low, the output voltage level is boosted according to a control signal level to be described later and when the input voltage level is high, the output voltage level assumes its normal relation to the input. On the other hand, the microphone 8, noise level detector 9, and control signal generator 10 are the same as described in the above-described preferred embodiments.

In this embodiment, the output control signal from the control signal generator 10 is sent to three parallelly connected multipliers 14A, 14B, 14C wherein the control signal is multiplied by three different constants a, b, and c. The three multipliers 14A, 14B, 14C are connected for output to the corresponding dynamic range controllers 31A, 31B, 31C. The three dynamic range controllers 31A, 31B, 31C are connected to a mixer 32 which combines the three output signals from the three dynamic range controllers 31A, 31B, 31C. The output terminal of the mixer 32 is connected to the main amplifier 4 via a variable resistor 33. The output terminal of the main amplifier 4 is connected to the speaker 6.

In the above-described configuration, when the microphone 8 picks up lound ambient noises and sends a signal corresponding to the noise level to the noise level detector 9, the control signal is sent to the multipliers 14A, 14B, 14C to be multiplied by the different constants a, b, c.

For example, if a=3, b=1, and c=2, the dynamic range controllers 31A, 31B and 31C amplify the audio signal as shown in solid lines (a), (b) and (c) of FIG. 12 when the ambient noise level is low and as shown by broken lines (d), (e), and (f) of FIG. 12 when the ambient noise level is higher.

Figure 13:
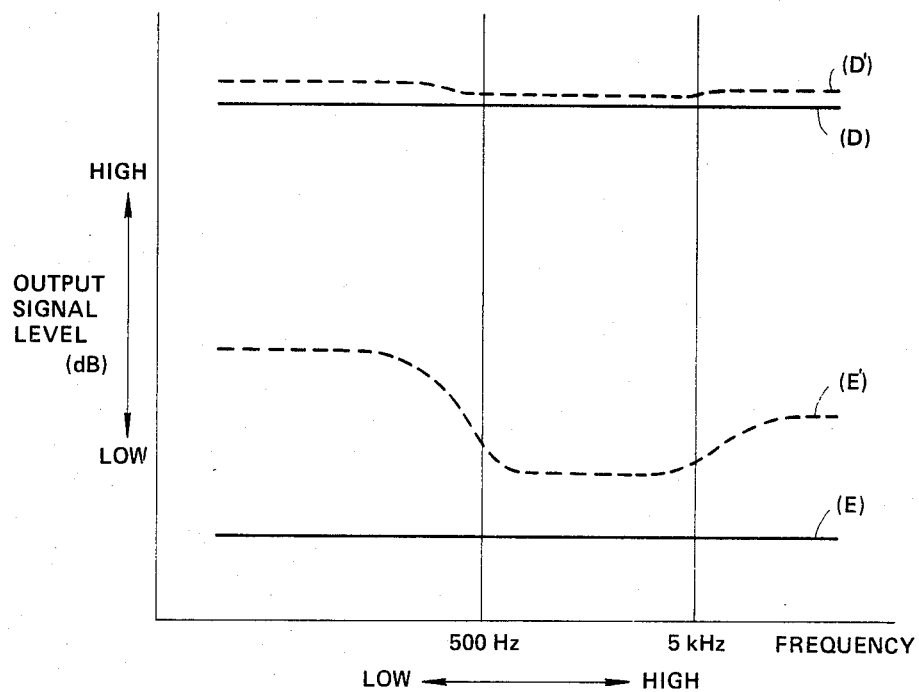
FIG. 13 is a graph illustrating the input-output relationship in three frequency ranges at maximum and minimum input levels.

Hence, the frequency characteristics of the audio output of the audio system shown in FIG. 11 at relatively low ambient noise levels are flat as shown in solid lines (D), (E) of FIG. 13. On the other hand, when the ambient noise level is increased, the frequency characteristics of the audio output are boosted in the low- and high-frequency ranges as shown by the broken lines (D'), (E'). In addition, as the audio signal level drops, the gain of the low-and high-frequency ranges relative to the midrange becomes more pronounced.

Figure 14:
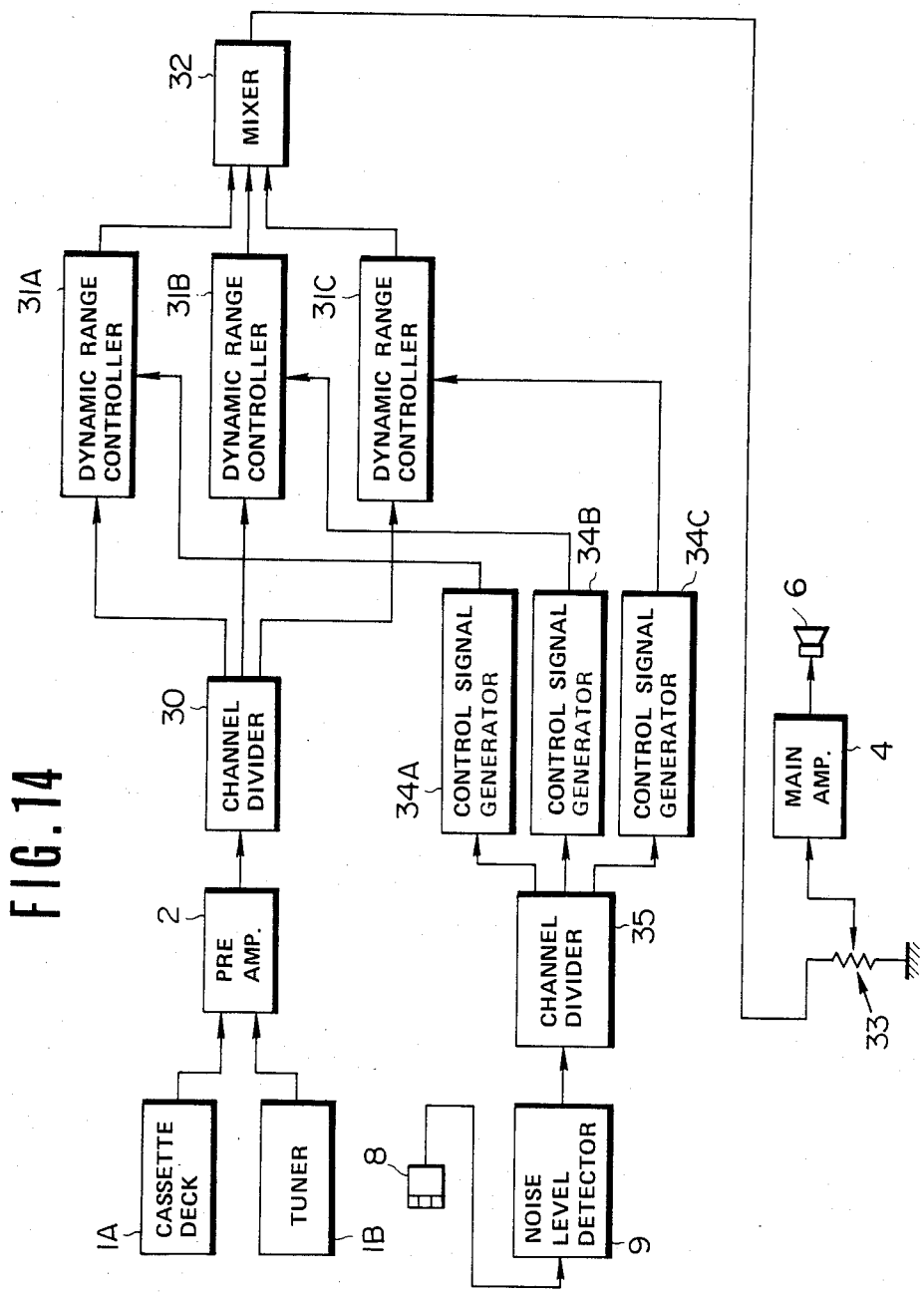
FIG. 14 is a block circuit diagram of a sixth preferred embodiment.

FIG. 14 shows a sixth preferred embodiment.

In FIG. 14, another channel divider 35 connected for input from the noise level detector 9 and for output separately to each of three control signal generators 34A, 34B, 34C divides the detected noise signal into three frquency ranges according to predetermined crossover frequencies, as in the channel divider 30. The control signal generators 34A, 34B, 34C independently output control signals based on the received noise level signals to a corresponding one of three dynamic range controllers 31A, 31B or 31C. The three dynamic range controllers 31A, 31B, 31C control the dynamic ranges of the corresponding frquency ranges of the audio signal so that each frequency band can controlled independently with regard to the selection of normal full-range amplification or signal-level-dependent gain boost according to ambient noise conditions.

As described hereinbefore, since the audio equipment according to the present invention adjusts the dynamic range of the audio signal to be reproduced through the speaker(s) in accordance with the ambient noise level and the resulting gain level, distortion due to overdriving the speakers and excessively loud output are prevented. At the same time, low-volume sounds which usually cannot be easily resolved or may even be drowned out by ambient noise can be boosted for the benefit of the listeners.

Therefore, even in cases where music is to be reproduced (from low volume (pianissimo) to high volume (fortissimo)), the listeners, i.e., vehicle occupants can enjoy music at appropriate volumes despite the influence of noise within passenger compartment. Even classical music exhibiting a wide volume range can clearly be resolved even in a noisy environment such as the passenger compartment of an automobile.

It will be clearly understood by those skilled in the art that the foregoing description is in terms of preferred embodiments and that various modifications may be made without departing from the spirit and scope of the present invention, which is to be defined by the appended claims.

What is claimed is:

1. Audio equipment comprising:
   (a) means for producing an audio signal;
   (b) means for detecting the level of noise surrouding the audio equipment;
   (c) means for controlling a dynamic range of the audio signal in accordance with the detected noise level;
   (d) means for reproducing the controlled audio signal; and
   (e) means for filtering high frequency components out of the audio signal to an extent in accordance with the noise level detected by said detection means.

2. The audio equipment according to claim 1, wherein said control means continuously adjusts the effective dynamic range of the audio signal in accordance with the detected noise level.

3. The audio equipment according to claim 1, wherein said control means controls the dynamic range of the audio signal such that the dynamic range is changed to a predetermined dynamic range value when said detection means detects that the noise level exceeds a predetermined noise level.

4. The audio equipment according to claim 1, wherein said detection means comprises a microphone disposed near the audio equipment and a control signal generator for converting an output of the microphone into a control signal and sending the control signal to said control means.

5. The audio equipment according to claim 1, wherein said detection means comprises other elements including a vehicle speed sensor, an engine speed sensor, an air conditioner fan speed switch, a door window opening angle sensor, a road surface monitor, a steering angle sensor, a tunnel-passage detector, wiper operation sensor, and a noise estimating means, said estimating means operable for estimating the noise level on the basis of data outputs from the other elements of said detection means, and a control signal generator for converting the estimated noise level into a control signal and sending the control signal to said control means.

6. The audio equipment according to claim 3, wherein the predetermined dynamic range width is approximately 40 dB.

7. The audio equipment according to claim 4, wherein said control means comprises a limiter connected to said audio signal producing means for limiting the audio signal level when said detection means detects that the noise level exceeds a predetermined value, a root-mean-square calculation circuit for calculating an average effective value of the limited audio signal and outputting a signal indicative of the average value, a calculation circuit which receives the output signal of the root-mean-square calculation circuit and said control signal for calculating $X^{1/\alpha}$, where $\alpha$ is the control signal value and X is the average effective value, an adder for adding the output result of the calculation circuit and said control signal, and a gain controller which receives the limited audio signals from said limiter and the output of said adder and controls the gain of the audio signal according to the adder output.

8. The audio equipment according to claim 1, wherein said reproducing means comprises a preamplifier, a main amplifier, a speaker connected to said main amplifier, and another speaker connected via said control means to said main amplifier.

9. The audio equipment according to claim 1, wherein said filtering means comprises a controlled low-pass filter connected to said detection means which filters out high-frequency components when the detected noise level exceeds a predetermined level.

10. The audio equipment according to claim 1, which further comprises means connected between said producing means and said reproducing means for dividing the audio signal into a plurality of signal components, each falling within one of a plurality of frequency bands and wherein said control means comprises a plurality of dynamic range controllers connected for output from said dividing means, each controlling a gain of the corresponding signal component in accordance with the noise level detected by said detection means.

11. The audio equipment according to claim 10, which further comprises a mixer for mixing the signal components from all of the dynamic range controllers into an audio output signal to be reproduced by said reproducing means.

12. The audio equipment according to claim 10, which further comprises a plurality of multipliers each connected between said detection means and a corresponding dynamic range controller for multiplying the detected noise level by a constant number.

13. The audio equipment according to claim 10, which further comprises means for dividing the noise level signal detected and outputted by said detection means into a plurality of noise signal components, each falling within one of a plurality of frequency bands and a plurality of control signal generators for converting corresponding noise signal components from said dividing means into corresponding control signals and sending said control signal to a corresponding dynamic range controller so that the dynamic range of each frequency band of the audio signal the noise level in the same frequency band.

14. Audio equipment comprising:
(a) means for producing an audio signal;
(b) means for detecting the level of noise surrounding the audio equipment;
(c) means for controlling a dynamic range of the audio signal in accordance with the detected noise level; and
(d) means for reproducing the controlled audio signal;
(e) said control means operable for continuously adjusting the effective dynamic range of the audio signal in accordance with the detected noise level,
(f) said control means further operable for controlling the dynamic range of the audio signal in such a way that an amplification gain factor applied to the audio signal remains constant at a maximum audio signal level and that the gain at the audio signal levels below the maximum increases as the detected noise level increases and as the audio signal level decreases.

15. The audio equipment according to claim 14, wherein the maximum audio signal level results in a sound pressure level of approximately 100 dB when reproduced acoustically by said reproduction means.

16. Audio equipment for a passenger compartment of an automotive vehicle, comprising:
(a) means for producing and amplifying an audio signal;
(b) means for detecting the noise level within the passenger compartment and outputting a signal indicative thereof;
(c) means for converting the noise level signal from said detecting means into a control signal;
(d) means for controlling the dynamic range of the amplified audio signal in accordance with the control signal; and
(e) means for reproducing the audio signal whose dynamic range is controlled by said controlling means;
(f) said control means operable for continuously adjusting the amplification gain of the audio signal when the audio signal level from said means for producing exceeds a predetermined decibel value.

17. The audio equipment according to claim 16, wherein said controls means controls the amplification gain of the audio signal such that the amplified audio signal level does not exceed a predetermined maximum value.

18. The audio equipment according to claim 16, wherein said control means selects one of a plurality of change of predetermined dynamic ranges in accordance with the noise level.

19. The audio equipment according to claim 16, wherein said control means controls the dynamic range of the audio signal in such a way that the amplification gain of the audio signal varies inversely with the audio signal level.

20. The audio equipment according to claim 16, wherein said predetermined value is substantially minus 40 dB.

21. The audio equipment according to claim 17, wherein said maximum value is approximately 100 dB.

22. The audio equipment according to claim 19, wherein said reproducing means is an acoustical speaker and said maximum audio signal level value results in an output of approximately 100 dB.

23. The audio equipment according to claim 19, wherein said audio signal producing and amplifying means comprises a cassette deck and further comprising means for filtering high-frequency components out of the audio signal in accordance with the noise level.

24. Audio equipment for the passenger compartment of a vehicle comprising:
   (a) means for producing and amplifying an audio signal;
   (b) means for dividing the audio signal into a plurality of frequency bands;
   (c) means for detecting the noise level within the passenger compartment and outputting a signal indicative thereof; and
   (d) means for controlling the individual dynamic ranges of the audio frequency bands in accordance with the detected noise level of the signal from said detecting means.

25. The audio equipment according to claim 24, which further comprises means for dividing the signal indicative of the noise level into a plurality of frequency bands matching the audio frequency bands and wherein said control means controls the individual dynamic ranges of the audio signal components in accordance with the noise level in the corresponding frequency band of the noise signal.

* * * * *